United States Patent [19]

Ogawa

[11] Patent Number: 5,321,662

[45] Date of Patent: Jun. 14, 1994

[54] DYNAMIC RANDOM ACCESS MEMORY DEVICE HAVING A SELF REFRESH MODE

[75] Inventor: Toshiyuki Ogawa, Hyogo, Japan

[73] Assignee: Mitsubishi Denki Kabushiki Kaisha, Tokyo, Japan

[21] Appl. No.: 45,152

[22] Filed: Apr. 12, 1993

[30] Foreign Application Priority Data

Oct. 9, 1992 [JP] Japan ................................. 4-271918

[51] Int. Cl.$^5$ .............................................. G11C 7/00
[52] U.S. Cl. .................................... 365/222; 365/191; 365/193
[58] Field of Search ........................ 365/222, 191, 193

[56] References Cited

U.S. PATENT DOCUMENTS

| | | |
|---|---|---|
| 4,691,303 | 9/1987 | Churchward et al. ............. 365/222 |
| 4,901,283 | 2/1990 | Hanbury et al. .................... 365/222 |
| 4,933,907 | 6/1990 | Kumanoya et al. ................. 365/222 |
| 4,935,900 | 6/1990 | Ohsawa .............................. 365/222 |
| 5,031,147 | 7/1991 | Maruyama et al. ................. 365/222 |

OTHER PUBLICATIONS

"Mitsubishi LSI's", pp. 1/28–10/28, 20/28, Oct. 1991.
Digest of Technical Papers, International Solid-State Circuits Conference, pp. 252–253, 1985 no month.

*Primary Examiner*—Eugene R. LaRoche
*Assistant Examiner*—Christopher R. Glembocki
*Attorney, Agent, or Firm*—Lowe, Price, LeBlanc & Becker

[57] ABSTRACT

An improved dynamic random access memory (DRAM) having self refresh mode is provided. After initiation of a self refresh term Ts, and in a first term Tc1 and a last term Tc2, a concentrated refresh using a refresh clock signal /REFS having a short period Pc is carried out for all rows in a memory cell array. During the remaining term, a normal self refresh operation using a signal /REFS having a long period Ps is carried out. Stored data is maintained effectively because the refresh interval of each row in a memory cell array is prevented from exceeding significantly a predetermined time length Ps.

17 Claims, 10 Drawing Sheets

DYNAMIC RANDOM ACCESS MEMORY DEVICE HAVING A SELF REFRESH MODE

BACKGROUND OF THE INVENTION

1. Field of the Invention

The present invention relates generally to dynamic random access memory devices, and more particularly, to improvement of a dynamic random access memory device having a self refresh mode.

2. Description of the Background Art

A dynamic random access memory (referred to as "DRAM" hereinafter) having a memory cell formed of one switching transistor and one data storing capacitor is widely used as a semiconductor memory suitable for increase in integration density in a semiconductor substrate. Because a DRAM holds a data signal by a capacitor, it is necessary to amplify periodically the data signals stored in the capacitor, i.e. a refresh operation must be carried out. Almost all of the recent DRAMs have a function to carry out refresh operation without needing an internal or external refresh control (generally called "a self refresh function"). An example of a DRAM including a self refresh feature is disclosed in U.S. Pat. No. 4,933,907 granted to the applicant of the present application. A document entitled "MITSUBISHI LSIs" (October 1991; pp. 1/28-10/28, 20/28) discloses a more specific self refresh operation in a DRAM.

FIG. 7 is a block diagram of a DRAM for showing the background of the present invention. Referring to FIG. 7, a DRAM 100 includes a memory cell array 1 including 4,718,592 memory cells arranged in rows and columns, a row decoder 2 for selecting a word line in memory cell array 1, a column decoder 3 for selecting a column of a memory cell to be accessed, an address buffer 4 for receiving address signals A0-A9 externally applied in a time divisional manner, a sense refresh amplifier 5 connected to a bit line in memory cell array 1, and an IO gate circuit 6 responsive to an output signal of column decoder 3 for selectively connecting a bit line in memory cell array 1 with an input buffer 7 and an output buffer 8. In FIG. 7, line 100 also indicates a semiconductor substrate.

A clock signal generator 9 responds to an externally applied row address strobe signal /RAS and a column address strobe signal /CAS to generate various clock signals for controlling a circuit in DRAM 100. Refresh control circuit 10 operates in response to a refresh control signal CBR provided from clock signal generator 9 to generate a refresh address signal RFA.

In writing operation, externally applied data signals DQ0-DQ8 are provided to IO gate circuit 6 via input buffer 7. Column decoder 3 selectively conducts one switching circuit (not shown) in IO gate circuit 6 by decoding a column address signal CA provided via address buffer 4. Therefore, the data signal is applied to a bit line (not shown) in memory cell array 1. Row decoder 2 decodes a row address signal RA provided via address buffer 4 to selectively activate one word line not shown. Thus, one data signal on a bit line is written into one memory cell (not shown) specified by row decoder 2 and column decoder 3.

In reading operation, a stored data signal is applied on a bit line (not shown) from a memory cell specified by row decoder 2. The data signal on the bit line is amplified by sense refresh amplifier 5. Because column decoder 3 selectively conducts one switching circuit (not shown) in IO gate circuit 6, the amplified data signal is provided to output buffer 8. Thus, data stored in memory cell array 1 is output via output buffer 8.

FIG. 8 is a circuit diagram showing a portion of a conventional bit line peripheral circuit. FIG. 9 is a timing chart for describing the operation shown in FIG. 8. The bit line peripheral circuit of FIG. 8 is described in Digest of Technical Papers, pp. 252-253 of International Solid-State Circuits Conference (ISSCC 85) held in 1985.

Referring to FIGS. 8 and 9, when a word line WLi is activated in reading operation, a switching transistor Qs of a memory cell MC is turned on. Therefore, the data signal stored in a capacitor Cs in memory cell MC appears on a bit line BLj. Because sense amplifier 5 formed by transistors Q1-Q4 is activated in response to activation control signals $S_P$ and $S_N$, a slight potential difference between bit lines BLj and /BLj is amplified by sense amplifier 5. A column select signal Yj of high level from column decoder 3 is supplied to the gates of transistors Q8 and Q9, whereby transistors Q8 and Q9 are turned on. Therefore, the data signal amplified by sense amplifier 5 is supplied to a pair IO lines 6a and 6b. The data signal on IO line pairs 6a and 6b is sent to output buffer 8.

Although a general read out operation has been described in the foregoing, it is to be noted that a similar operation is carried out in a refresh operation. However, a column select signal Yj of a high level is not provided in a refresh operation, so that transistors Q8 and Q9 are not turned on. The data signal amplified by sense amplifier 5 is applied to capacitor Cs again via a conductive switching transistor Qs. That is to say, although the signal charge held in capacitor Cs gradually decreases in accordance with time, the signal charge is restored by a periodic amplification and rewrite operation by sense amplifier 5. A refresh operation of a DRAM is carried out as described above in a detailed circuit.

FIG. 10 is a circuit block diagram of a refresh control circuit 10 shown in FIG. 7. Referring to FIG. 10, clock signal generator 9 includes a CBR detection circuit 14 for detecting a CAS-before RAS (referred to as "CBR" hereinafter) refresh mode. CBR detection circuit 14 detects a low level of an externally applied column address strobe signal /CAS prior to the fall of an externally applied row address strobe signal /RAS, whereby an externally requested CBR refresh mode is detected. When a CBR refresh mode is detected, CBR detection circuit 14 generates a signal CBR.

Refresh control circuit 10 includes an oscillator 11 for generating a clock signal $\phi i$, a timer circuit 12 for generating a refresh clock signal /REFS, and a refresh address counter 13 for generating an internal refresh address signal RFA.

FIG. 11 is a timing chart for describing the operation of the circuit shown in FIG. 10. Referring to FIG. 11, after the fall of signal /CAS at time t3, signal /RAS falls at time t4. CBR detection circuit 14 shown in FIG. 10 supplies signal CBR to oscillator 11 and timer circuit 12.

Oscillator 11 responds to signal CBR to generate a clock signal $\phi i$. Timer circuit 12 initiates a self refresh mode operation by detecting a continuation of signal /RAS at a low level for more than a predetermined time length Tw (for example 100 $\mu$s) after the provision of signal CBR. More specifically, timer circuit 12 generates a clock signal /REFS for self refresh in response to clock signal φi after time t5 shown in FIG. 11. Clock signal /REFS is applied to clock signal generator 9 and refresh address counter 13.

Therefore, after time t5, refresh address counter 13 counts a self refresh clock signal /REFS to generate a refresh address signal RFA. The refresh address signal RFA is supplied to row decoder 2 via address buffer 4 shown in FIG. 7, whereby a refresh operation of memory cell array 1 is carried out. Self refresh clock signal /REFS has a predetermined period Ps. The increment interval of refresh address signal RFA is determined by the time length of Ps.

At time t8, signals /RAS and /CAS rise, whereby the self refresh operation is completed. After time t8, the DRAM returns to the normal operation mode. Referring to FIG. 11, term Ts indicates a self refresh period (not less than 100 μs), and term Tn indicates a normal operation period.

For a 1 megabit DRAM having an organization of (256 rows×256 columns)×16 bits, the maximum time interval required for 256 memory cells connected to one row is 4 ms, for example. It is necessary to sequentially refresh 256 rows in the memory cell array during this time interval. The refresh period Ps in a self refresh operation is generally set to 8–16 times an externally requested refresh period, for example, a CBR refresh period. The power consumption in a self-refresh operation can be reduced by reducing the number of times of charging a bit line per a unit time. Here, a refresh period is equivalent to a time length from a refresh operation of one row in a memory cell array to the next refresh operation of that row. Presuming that the self refresh period is set to 64 ms, the period Ps of clock signal /REFS shown in FIG. 11 is 250 μs (=64 ms÷256 rows).

FIG. 12 is a timing chart showing the operation of the circuit of FIG. 11 in a range of a longer time period. Referring to FIG. 12, it is presumed that memory cells of all the rows (for example 256 rows) in the memory cell array are refreshed by an externally requested refresh operation (for example, a CBR refresh) within term Tec starting from time t1 to time t2. During term Tec, 256 rows in the memory cell array are refreshed starting from a beginning row SR1 to a last row LR1.

A self refresh operation is initiated from time t5. During term $\Delta T0$, a starting row SR2 to a last row LR2 are refreshed of the 256 rows in the memory cell array. This time length $\Delta T0$ is equivalent to a self refresh period, i.e. 64 ms in the above-described example. A DRAM in this embodiment is ensured by design that stored data is effectively maintained as long as each memory cell row is refreshed at a time interval of $\Delta T0$.

However, it can be appreciated from FIG. 12 that a last row in the memory cell array is refreshed at time t2 (LR1), and then refreshed at time t6 (LR2). It is apparent that the time length $\Delta T1$ starting from time t2 to time t6 exceeds the time length of $\Delta T0$. This means that the maintenance of the data stored in the last memory cell row is not guaranteed. In other words, the data stored in the last memory cell row may be lost.

Similarly, it is presumed that an externally requested refresh operation is initiated at time t9 after the termination of a self refresh operation at time t8. Therefore, a beginning row SR4 to a last row LR4 of 256 rows in the memory cell array are refreshed during term Tec starting from time t9 until time t10. As a result, the last row in the memory cell array is refreshed at time t6 (LR2), and then the refreshed at time t10 (LR4). It is apparent that the time length of $\Delta T2$ from time t6 to time t10 is longer than the time length of $\Delta T0$. Therefore, the data stored in the last memory cell row may be lost.

In order to prevent stored data from being lost, the time length from time t2 to t4 shown in FIG. 12 was limited to be not so longer than time length $\Delta T1$ in a conventional DRAM. That is to say, operational limitation in an external circuit was required.

SUMMARY OF THE INVENTION

An object of the present invention is to prevent stored data from being lost in a dynamic random access memory device having a self refresh mode.

Another object of the present invention is to relieve limitation of operation of an external circuit for maintaining stored data in a dynamic random access memory device.

Briefly, a dynamic random access memory device according to the present invention includes a memory cell array having a plurality of memory cells arranged in rows and columns, a detection circuit for detecting non-provision of an external refresh request signal during a predetermined time length, a short time refresh circuit for refreshing the memory cell array in a predetermined short time for refreshing a memory cell array in a predetermined long time longer than the predetermined short time, and a long time refresh circuit.

In operation, when a refresh request signal is not provided during a predetermined time length, the short time refresh circuit refreshes all the memory cells in the memory cell array in a predetermined short time. As a result, the refresh interval of a memory cell array is prevented from exceeding significantly a predetermined long time, whereby stored data can be maintained efficiently.

According to another aspect of the present invention, a dynamic random access memory device includes a memory cell array having a plurality of memory cells arranged in rows and columns, a detection circuit for detecting non-provision of an external refresh request during a predetermined time length, a long time refresh circuit responsive to the detection circuit for refreshing repeatedly the memory cell array in a predetermined long time, and a short time refresh circuit responsive to an externally applied refresh termination signal for refreshing the memory cell array in a predetermined short time shorter than the predetermined long time.

In operation, the short time refresh circuit responds to an externally applied refresh termination signal to refresh all rows in the memory cell array in a predetermined short time. As a result, the refresh interval of a memory cell array is prevented from exceeding significantly a predetermined long time, so that stored data can be maintained efficiently.

According to a further aspect of the present invention, a dynamic random access memory device includes a memory cell array having a plurality of memory cells arranged in rows and columns, a detection circuit for detecting non-provision of an external refresh request during a predetermined time length, a first short time refresh circuit responsive to the detection circuit for refreshing the memory cell array in a first predetermined short time, and a long time refresh circuit for refreshing the memory cell array in a predetermined long time longer than the first predetermined short time after elapse of the first predetermined short time, and a second short time refresh circuit responsive to an externally applied refresh termination signal for refreshing the memory cell array in a second predetermined short time shorter than the predetermined long time.

According to still another aspect of the present invention, a dynamic random access memory device includes a memory cell array having a plurality of memory cells arranged in rows and column, a detection circuit for detecting non-provision of an external refresh request during a predetermined time length, a short period clock signal generating circuit for generating a short period clocks signal having a predetermined short, a long period clock signal generating circuit for generating a long period clock signal having a predetermined long period that is longer than the predetermined short period, a selector circuit responsive to the detection circuit for providing a short period clock signal in the predetermined short time term, and for providing a long period clock signal after the predetermined short time term, and a refresh address generating circuit responsive to a clock signal provided from the selector circuit for generating a refresh address signal to refresh the memory cell array.

According to a still further aspect of the present invention, a dynamic random access memory device includes a memory cell array having a plurality of memory cells arranged in rows and columns, a detection circuit for detecting non-provision of an external refresh request in a predetermined time length, a short period clock signal generating circuit for generating a short period clock signal having a predetermined short period, a long period clock signal generating circuit for generating a long period clock signal having a predetermined long period longer than the predetermined short period, a selector circuit responsive to the detection circuit for providing a long period clock signal during a predetermined long time term, and for providing a short period clock signal in response to an externally applied refresh termination signal, and a refresh address generating circuit responsive to a clock signal provided from the selector circuit for generating a refresh address signal to refresh the memory cell array.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
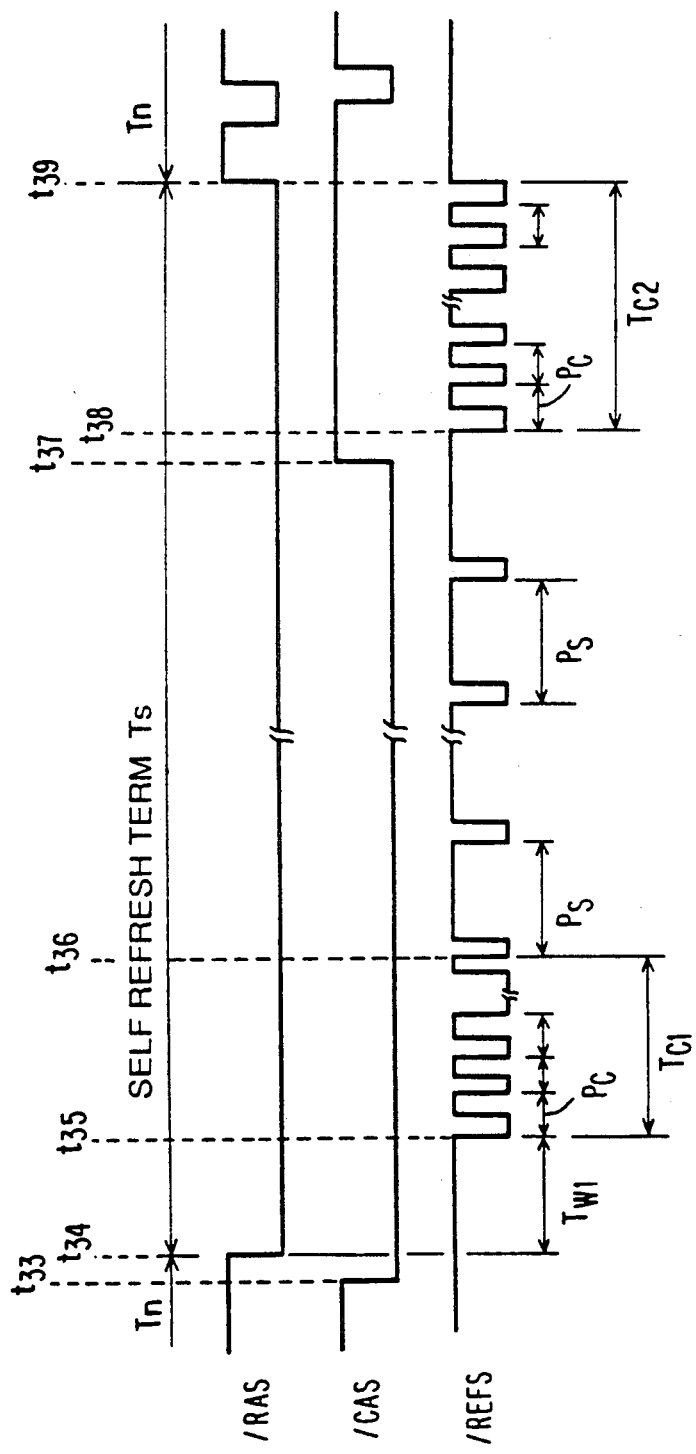
FIG. 1 is a timing chart for describing a self refresh operation according to an embodiment of the present invention.

Referring to FIG. 1, signal /RAS falls at time t34 after signal /CAS is brought to a low level at time t33. Therefore, a CBR refresh mode is recognized by the DRAM after time t34.

A self refresh mode operation is initiated upon a detection of signal /RAS maintaining a low level over a predetermined time length TW1 (for example 10 $\mu$s-100 $\mu$s) after time t34. More specifically, a first concentrated refresh operation is carried out in term Tc1 (a first predetermined short time) from time t35 to time t36. During this term Tc1, self refresh clock signal /REFS changes at a period of Pc (for example 200 ns) that is shorter than a normal self refresh clock period Ps (for example 250 $\mu$s). During the first concentrated refresh term Tc1, refresh address counter 13 responds to signal /REFS having a short period Pc to generate a refresh address signal RFA that increments at a short period Pc. All the memory cell rows (for example 256 rows) in the memory cell array are refreshed during the first concentrated refresh term Tc1. Term Tc1 is 51.2 $\mu$s (=200 ns×256 rows).

During the term to time t38 from time t36 (a predetermined long time length), a normal self refresh operation is carried out. More specifically, a clock signal /REFS having a normal self refresh period Ps is supplied to refresh address counter 13. Refresh address counter 13 generates a refresh address signal RFA incremented at a time length of Ps.

At time t37, signal /CAS rises, whereby the termination of a self refresh mode is recognized. Therefore, a second concentrated refresh term (a second predetermined short time) Tc2 is initiated from time t38. During the second concentrated refresh term Tc2, self refresh clock signal /REFS changes at a predetermined short period Pc. Refresh address counter 13 responds to a refresh clock signal /REFS having a short period Pc to generate a refresh address signal RFA incremented at a short time length Pc. As a result, all the memory cell rows in the memory cell array are refreshed during a short time during the second concentrated refresh term Tc2.

After time t39, a self refresh operation is substantially terminated in response to the rise of signal /RAS, whereby the DRAM returns to a normal operation mode.

Figure 2:
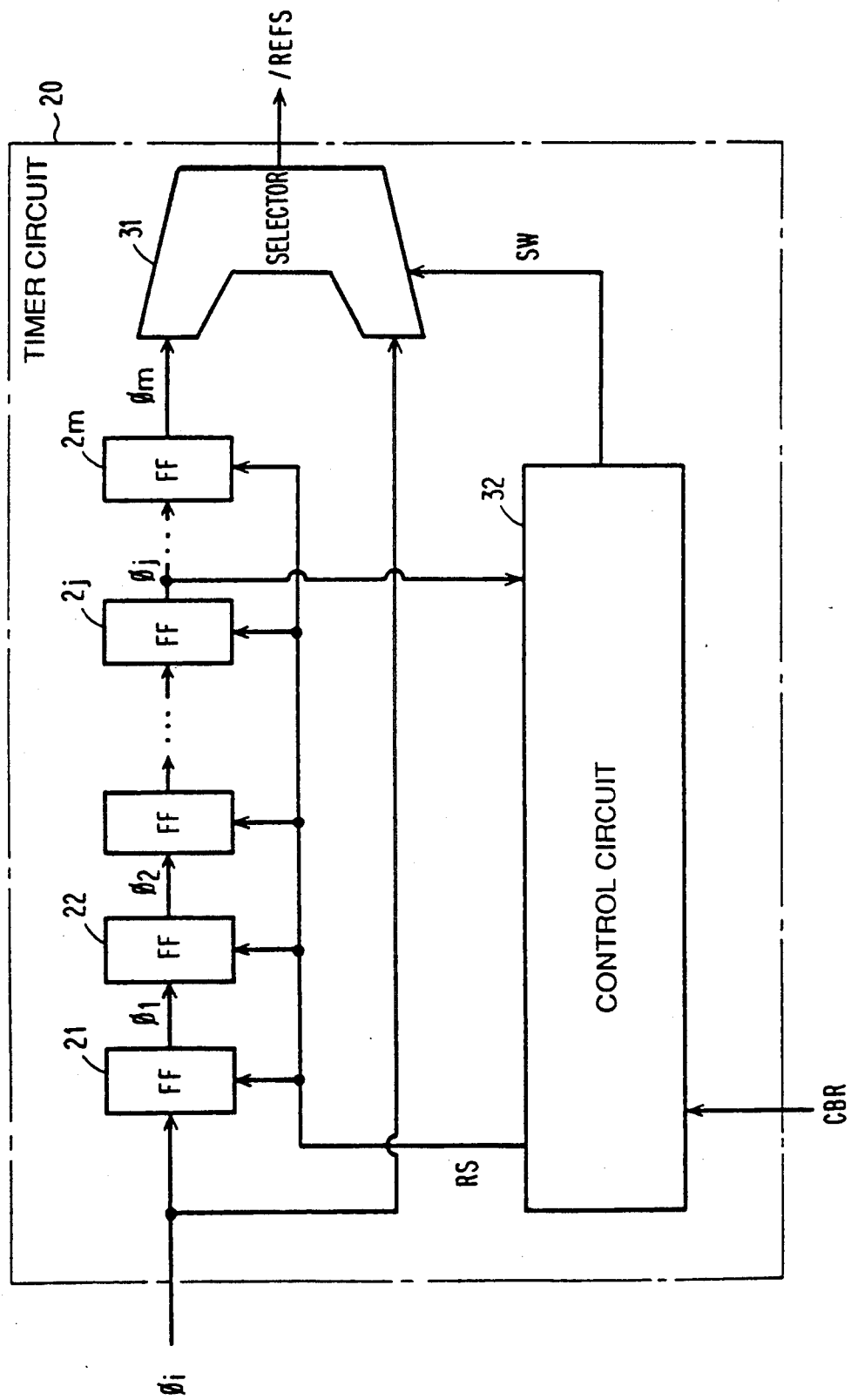
FIG. 2 is a circuit block diagram of a timer circuit used in the embodiment of FIG. 1.

FIG. 2 is a circuit block diagram of a timer circuit used in the embodiment of FIG. 1. The timer circuit 20 of FIG. 2 is provided in an improved refresh control circuit instead of the timer circuit 12 of FIG. 10.

Figure 10:
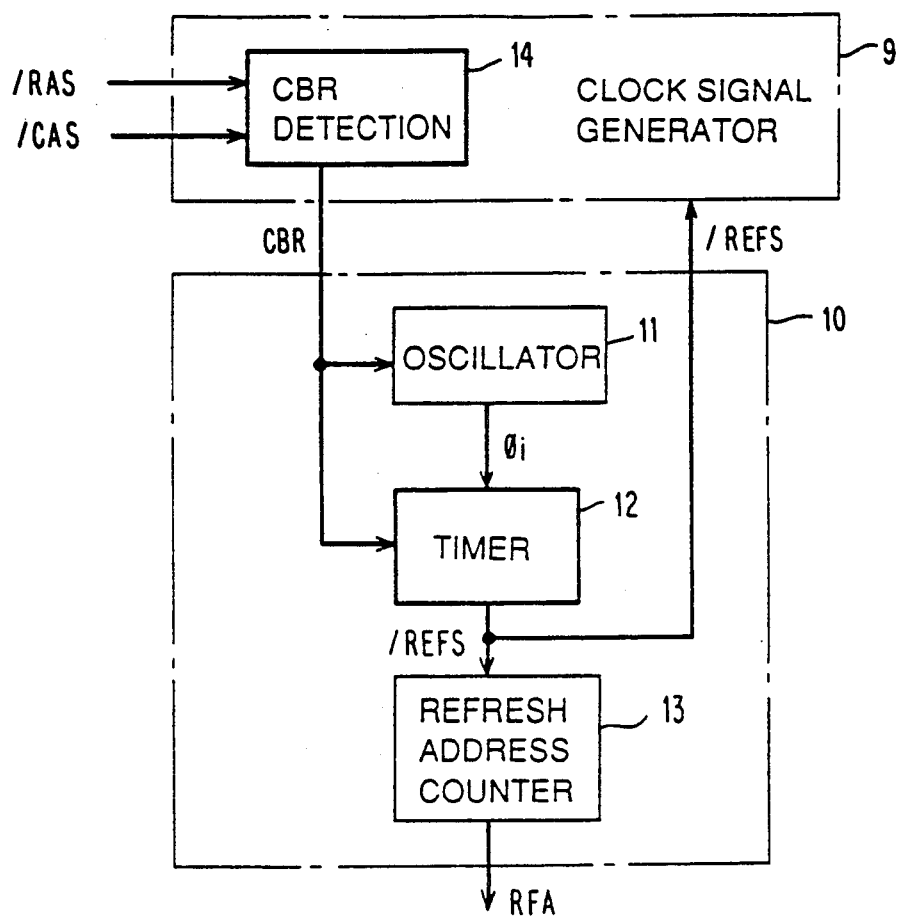
FIG. 10 is a circuit block diagram of the refresh control circuit of FIG. 7.
Figure 11:
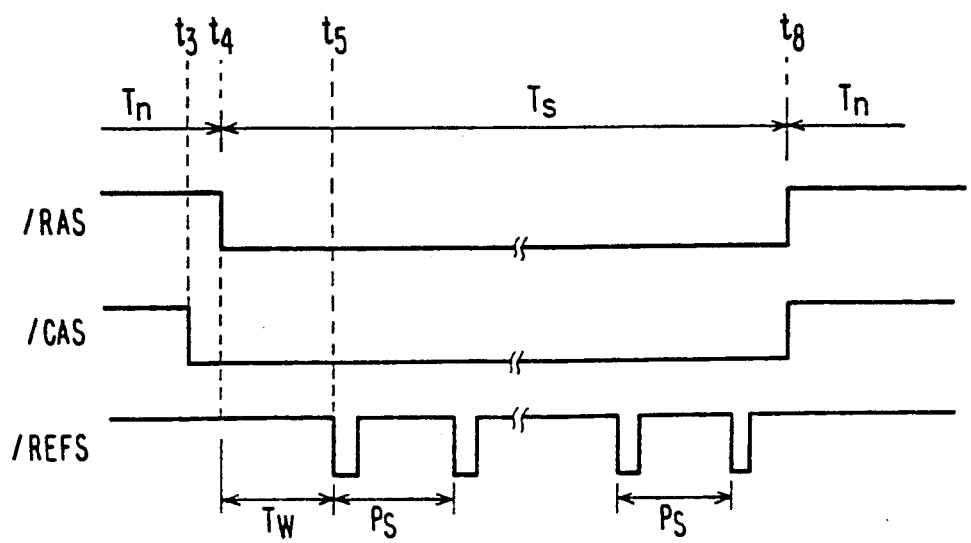
FIG. 11 is a timing chart for describing the operation of the circuit shown in FIG. 10.

Referring to FIG. 2, timer circuit 20 includes m toggle flipflops (FF) 21-2m forming a binary counter, a selector 31 selecting either a clock signal $\phi$i or $\phi$m, and a control circuit 32. A clock signal $\phi$i having a short period Pc (for example 200 ns) from oscillator 11 shown in FIG. 10 is supplied as an input clock signal $\phi$i. The last flipflop 2m provides a clock signal $\phi$m having a long period Ps (for example 250 $\mu$s). Control circuit 32 receives a signal CBR indicating an externally requested CBR refresh mode from CBR detection circuit 14 of FIG. 10. Control circuit 32 carries out the operation shown in the flow charts of FIGS. 3 and 4.

Figure 3:
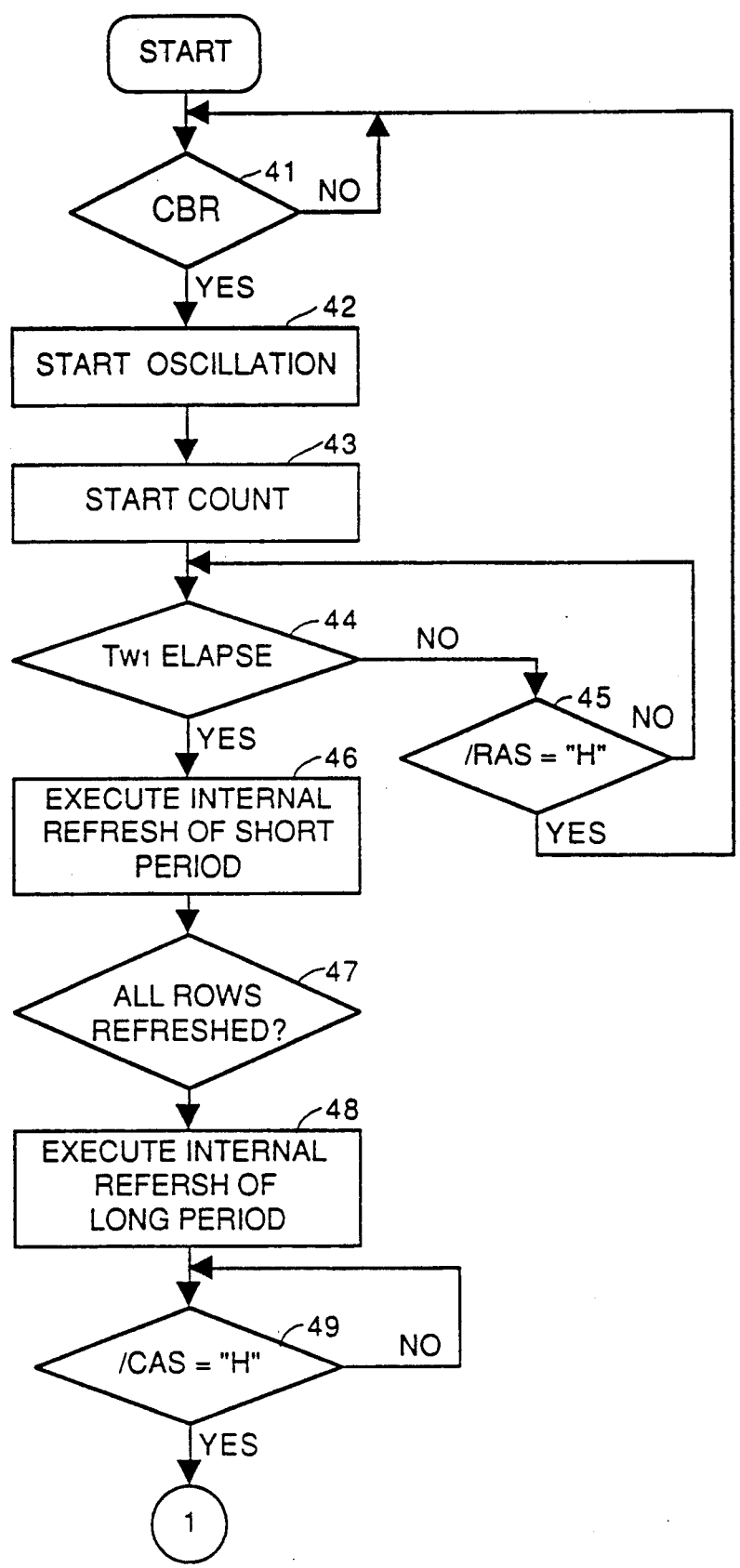
FIG. 3 is a flow chart of the first half of a self refresh operation according to the embodiment of FIG. 1.
Figure 4:
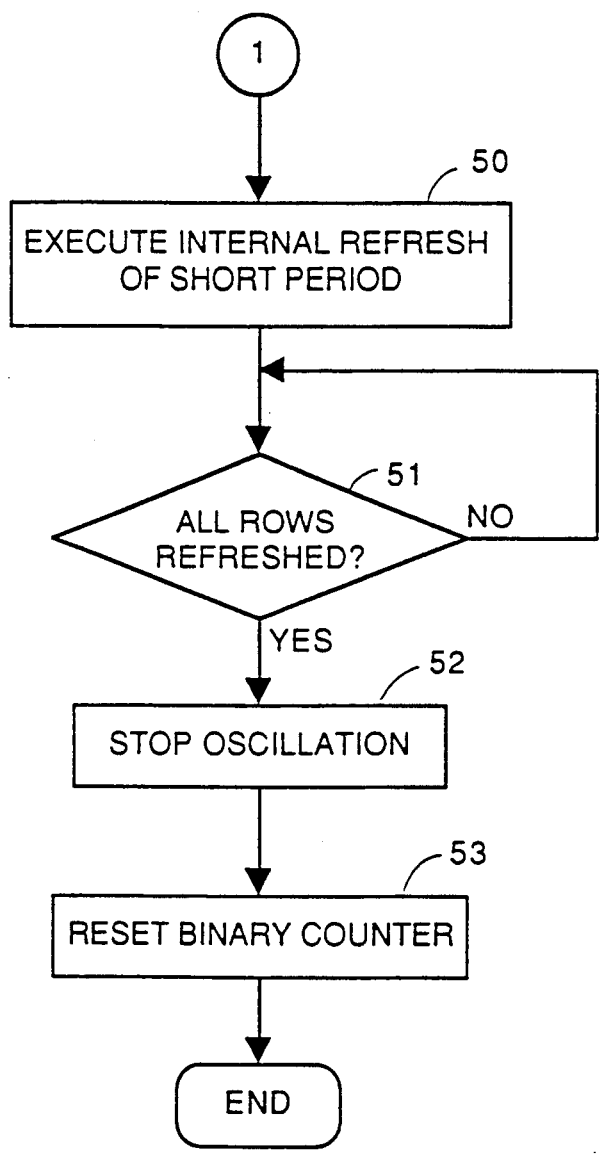
FIG. 4 is a flow chart of the latter half of the self refresh operation in the embodiment of FIG. 1.

FIGS. 3 and 4 are flow charts of a self refresh operation of the embodiment shown in FIG. 1. Referring to FIG. 3, detection of a CBR refresh mode request is detected at step 41. More specifically, CBR detection circuit 14 of FIG. 10 generates a signal CBR upon detecting the fall of signal /RAS after signal /CAS is brought to a low level.

At step 42, oscillator 11 initiates the generation of clock signal $\phi i$ in response to signal CBR. At step 43, timer circuit 20 shown in FIG. 2 initiates the count of clock signal $\phi i$ in response to signal CBR.

At steps 44 and 45, detection of the maintenance of signal /RAS held at a low level exceeding a predetermined time length Tw1 is detected. The identification of time length Tw1 is carried out by control circuit 32 detecting a change in clock signal $\phi j$ (this clock signal has a period Tw1) provided from the j-th flipflop 2j of FIG. 2. When this requirement is satisfied, the procedure proceeds to step 46, otherwise to step 41.

At step 46, an internal refresh operation of a short period is executed. More specifically, a self refresh using refresh clock signal /REFS having a short period Pc is carried out for all the rows (refer to step 47) in the memory cell array. More specifically, control circuit 32 shown in FIG. 2 supplies a switching control signal SW to selector 31 for selecting an input clock signal $\phi i$. Selector 31 responds to an applied signal SW to provide an input clock signal $\phi i$ having a short period Pc as a refresh clock signal /REFS. A number of clock pulses corresponding to the number of all the rows in the memory cell array are provided as refresh clock signal /REFS.

At step 48, an internal refresh operation of a long period is executed. More specifically, during the term of time t36 to t37, control circuit 32 of FIG. 2 provides a switching control signal SW to selector 31 for selecting an output clock signal $\phi m$ from the last flipflop 2m. Therefore, selector 31 provides a clock signal $\phi m$ having a long period Ps as a refresh clock signal /REFS. As a result, self refresh using a refresh clock signal /REFS having a long period Ps (for example 250 μs) is repeated for the memory cell array.

At step 49, a rise of signal /CAS is detected. When signal /CAS attains a high level, an external request of termination of a self refresh mode is recognized, and the procedure proceeds to step 50 of FIG. 4.

Referring to FIG. 4, at step 50, internal refresh of a short period is again executed. More specifically, during the second concentrated refresh term Tc2 after time t38, control circuit 32 of FIG. 2 provides a switching control signal SW to selector 31 for selecting an input clock signal $\phi i$ having a short period Pc. Selector circuit 31 responds to an applied switching control signal SW to provide clock signal $\phi i$ as refresh clock signal /REFS. As a result, self refresh using self refresh clock signal /REFS having a short period Pc is carried out for all the rows (refer to step 51) in the memory cell array.

At step 52, the generation of a clock signal $\phi i$ from oscillator 11 is stopped. At step 53, the binary counter formed of flipflops 21-2m is reset. More specifically, a reset signal RS is provided from control circuit 32 of FIG. 2, whereby all flipflops 21-2m are reset. After time t39, the DRAM returns to the normal operation mode.

In the embodiment of FIG. 1, concentrated refresh is carried out in the first term Tc1 and the last term Tc during the self refresh term Ts. In another embodiment set forth in the following, concentrated refresh is carried out only in either of the terms.

Figure 5:
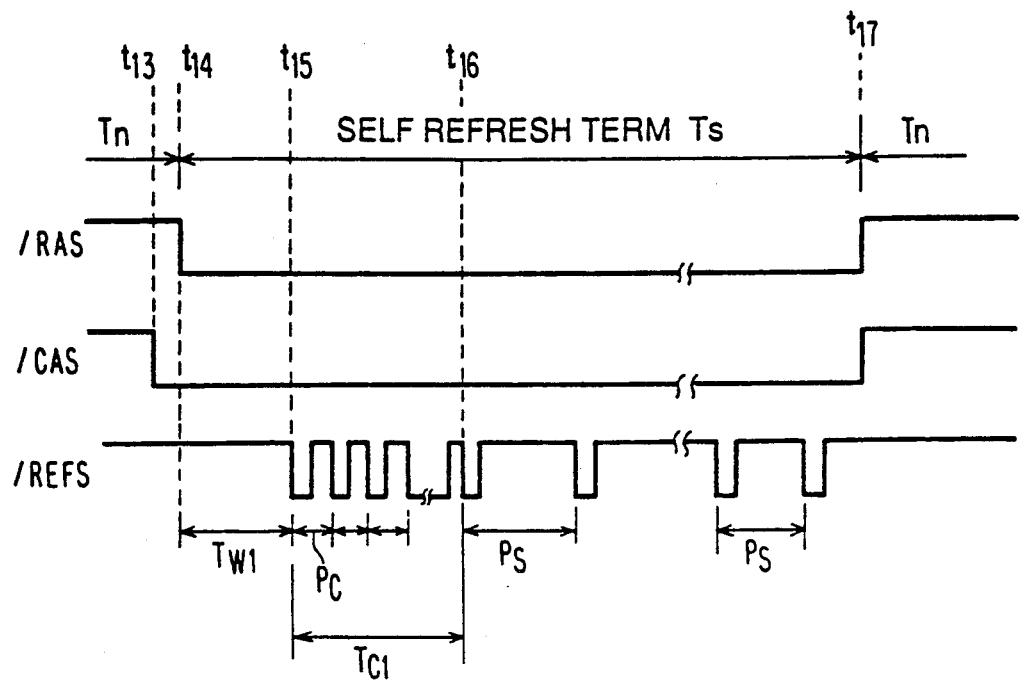
FIG. 5 is a timing chart for describing a self refresh operation according to another embodiment of the present invention.

FIG. 5 is a timing chart for describing a self refresh operation in another embodiment of the present invention. As shown in FIG. 5, a self refresh using a refresh clock signal /REFS having a short period Pc is carried out for the memory cell array during only the first term Tc1 in the self refresh term Ts.

Figure 6:
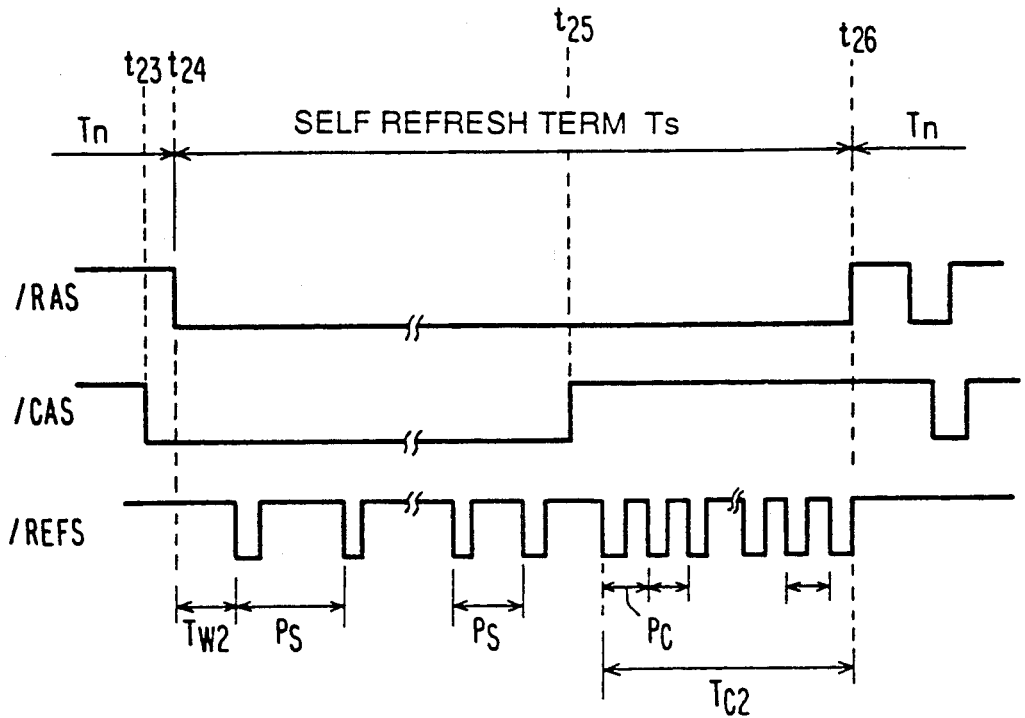
FIG. 6 is a timing chart for describing a self refresh operation according to a further embodiment of the present invention.
Figure 7:
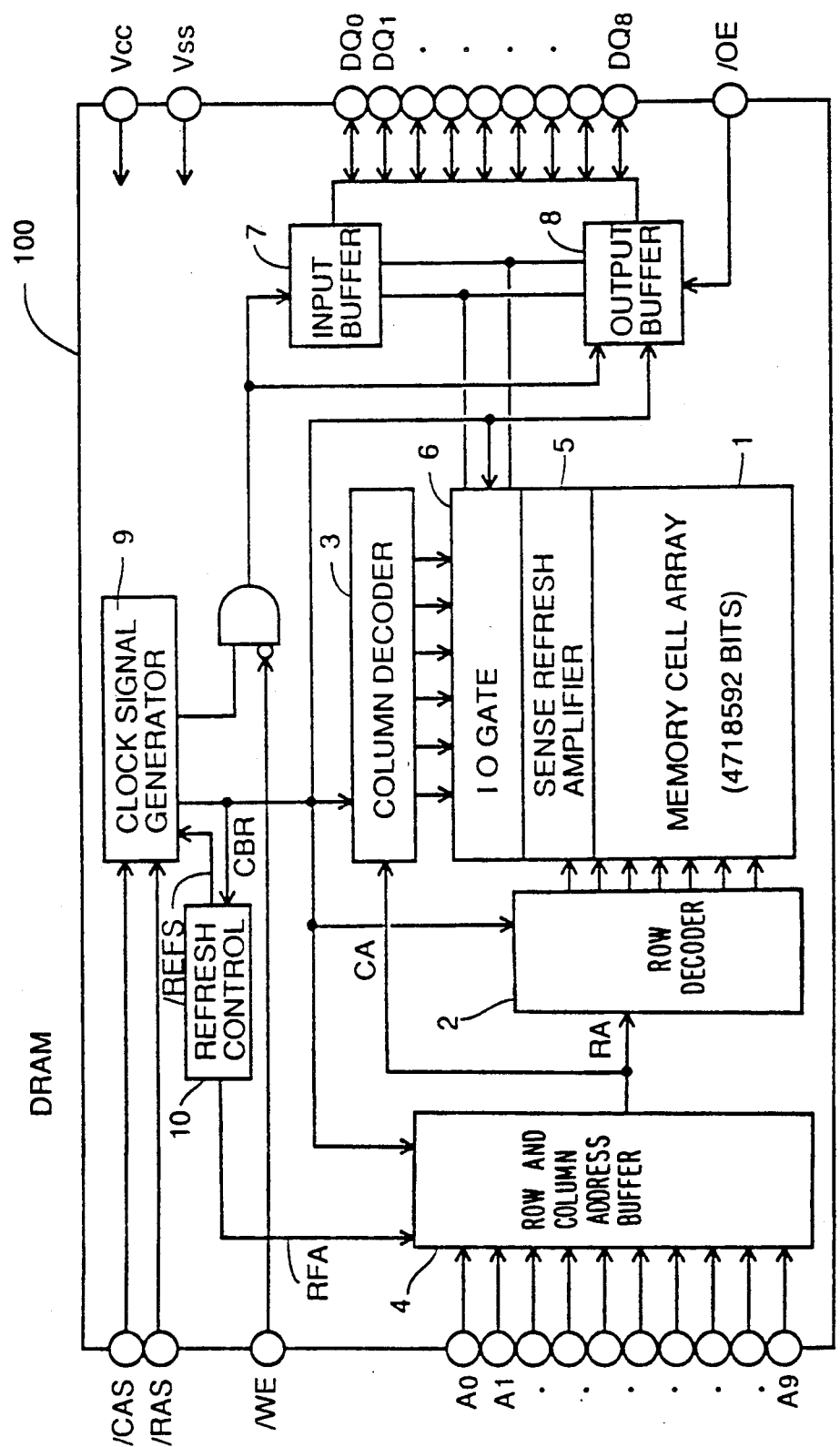
FIG. 7 is a block diagram of a DRAM for showing the background of the present invention.
Figure 8:
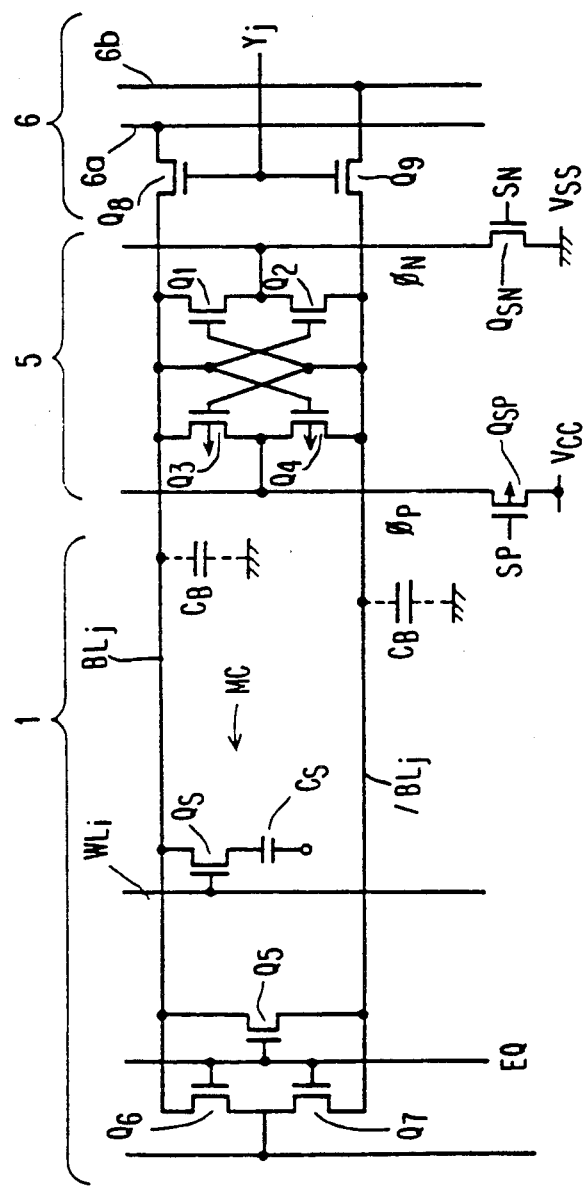
FIG. 8 is a circuit diagram of a conventional bit line peripheral circuit.
Figure 9:
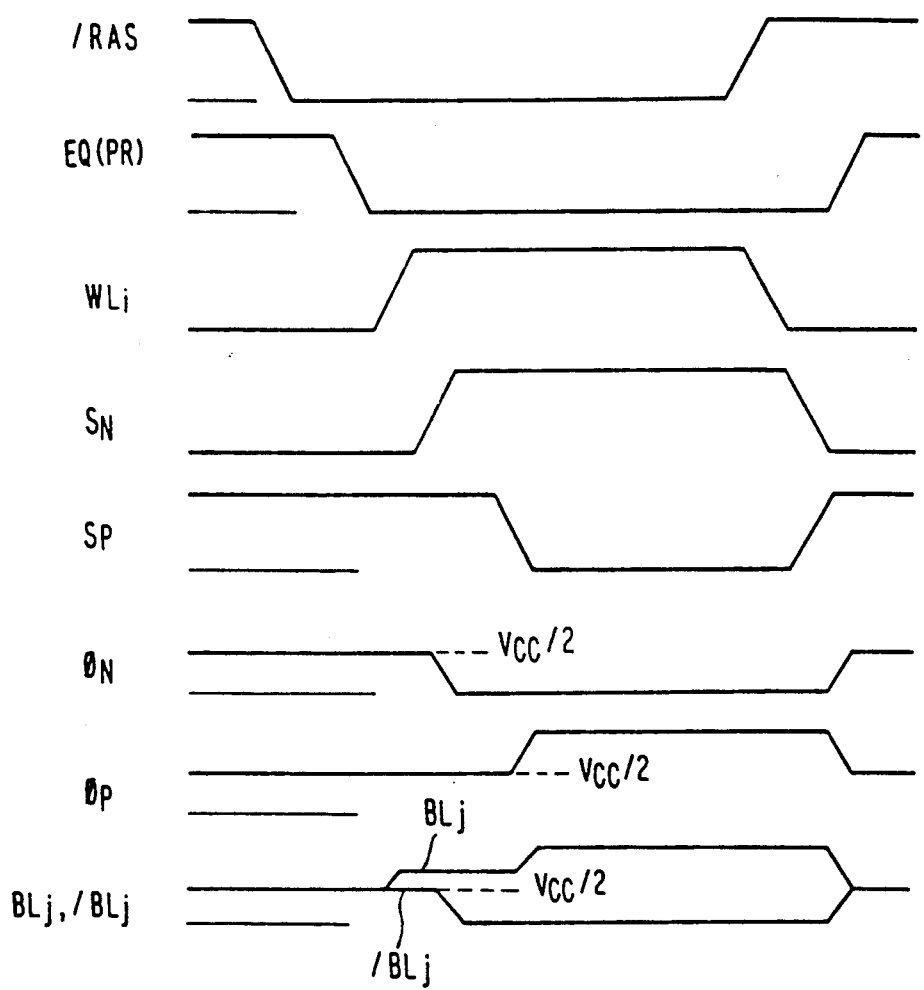
FIG. 9 is a timing chart for describing the operation of the circuit shown in FIG. 8.

FIG. 6 is a timing chart for describing a self refresh operation according to a further embodiment of the present invention. As shown in FIG. 6, a self refresh using a refresh clock signal /REFS having a short term Tc is carried out for the memory cell array during the last term Tc2 in self refresh term Ts.

It is pointed out that the embodiments shown in FIGS. 5 and 6 can be realized by simplifying or reducing the procedures shown in FIGS. 3 and 4. In the embodiment shown in FIG. 5, control circuit 32 of FIG. 2 provides a switching control signal SW to selector 31 for selecting an input clock signal $\phi i$ during term Tc1 between time t15 to time t16. Therefore, a concentrated refresh can be executed at term Tc1 because selector 31 provides a clock signal $\phi i$ having a short period Pc as a refresh clock signal /REFS. During time t16 to t17, control circuit 32 provides a switching control signal SW to selector 31 for selecting a clock signal $\phi m$ having a long period Ps. A self refresh operation of a normal speed is carried out during this term (from time t16 to t17) because selector 31 provides a refresh clock signal /REFS having a long period Ps. At time t17, signals /RAS and /CAS rise, whereby a self refresh term Ts is terminated.

In the embodiment shown in FIG. 6, control circuit 32 of FIG. 2 provides a switching control signal SW to selector 31 for selecting a clock signal $\phi m$ having a long period Ps during the term of time t24 to t25. Therefore, a self refresh of a normal speed is executed during this term (time t24 to t25) because selector 31 provides a refresh clock signal /REFS having a long period Ps. After time t25 in concentrated refresh term Tc2, control circuit 32 provides a switching control signal SW to selector 31 for selecting an input clock signal $\phi i$ having a short period Pc. Therefore, a concentrated refresh is executed during term Tc2 because selector 31 provides a refresh clock signal /REFS having a short period Pc.

Figure 12:
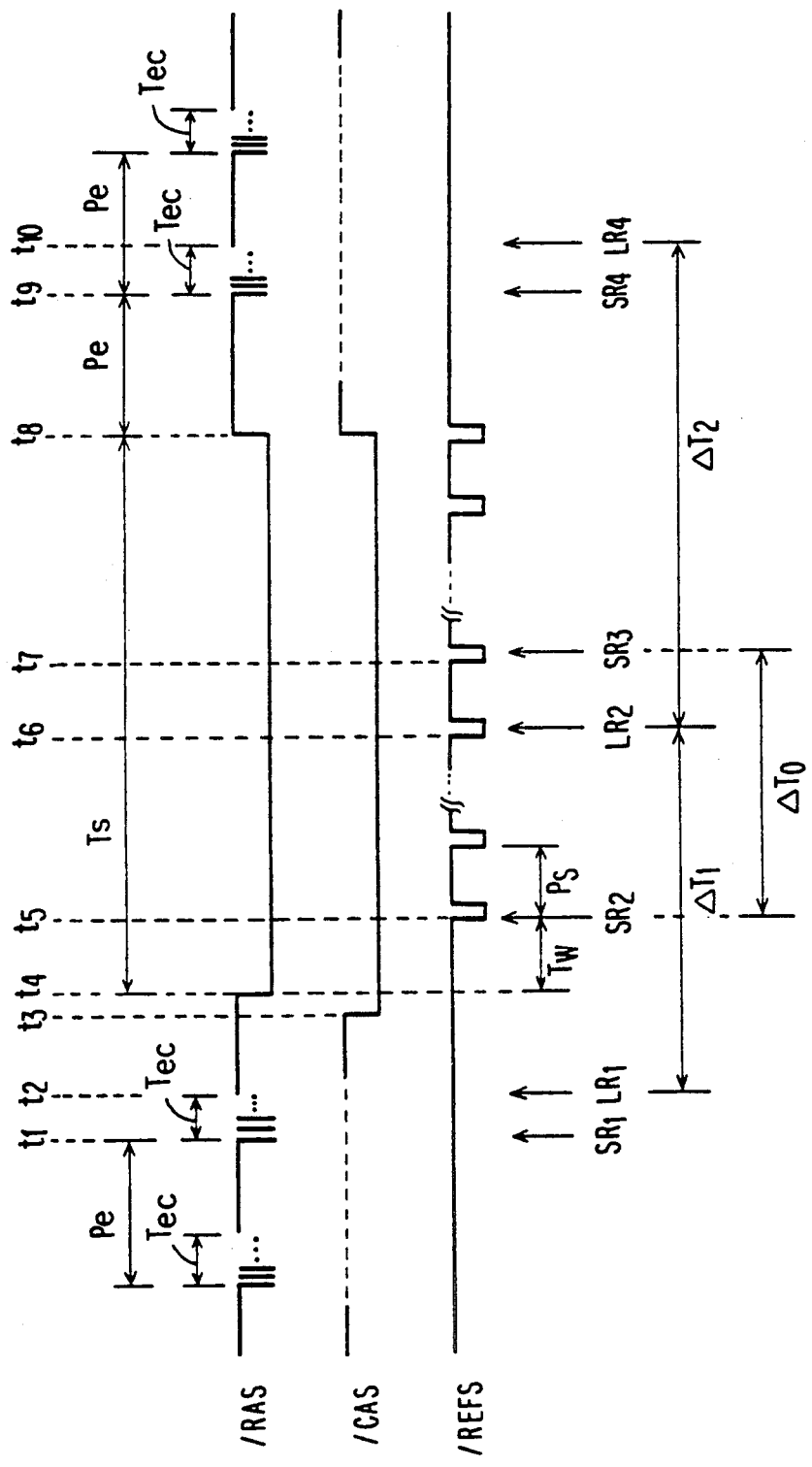
FIG. 12 is a timing chart for describing the operation of the circuit of FIG. 10 in a longer range of time.

The embodiments shown in FIGS. 1, 5 and 6 have a refresh operation carried out for all the rows (for example 256 rows) in the memory cell array in the first term Tc1 and/or the last term Tc2 of the self refresh term Ts, whereby the refresh interval of the memory array can be prevented from exceeding significantly a designed refresh interval (the time length ΔT0 shown in FIG. 12). Because a concentrated refresh is executed right after the initiation and/or right before the end of a self refresh, one row (the last row) in the memory cell array can be refreshed without a significant excess of the time length ΔT0. Because stored data can be maintained efficiently, the time interval from time t2 to time t4 shown in FIG. 12 does not have to be controlled by an external circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device comprising:
   a memory cell array including a plurality of memory cells arranged in rows and columns,
   detection means for detecting non-provision of an externally applied refresh request signal during a predetermined time length,
   short time refresh means responsive to said detection means for refreshing said memory cell array in a predetermined short time, and
   long time refresh means for refreshing said memory cell array in a predetermined long time longer than said predetermined short time after elapse of said predetermined short time.

2. The dynamic random access memory device according to claim 1, wherein said detection means comprises
   external refresh mode detection means responsive to an externally applied refresh request signal for detecting specification of an external refresh mode, and
   time length detection means responsive to said external refresh mode detection means for detecting non-specification of the external refresh mode during said predetermined time length.

3. The dynamic random access memory device according to claim 2, wherein said externally applied refresh request signal comprises a row address strobe signal and a column address strobe signal,
   wherein said external refresh mode detection means comprises CAS-before-RAS refresh mode detection means for detecting a low level of the column address strobe signal prior to the fall of the row address strobe signal.

4. A dynamic random access memory device comprising:
   a memory cell array including a plurality of memory cells arranged in rows and columns,
   detection means for detecting non-provision of an externally applied refresh request during a predetermined time length,
   long time refresh means responsive to said detection means for refreshing said memory cell array during a predetermined long time, and
   short time refresh means responsive to an externally applied refresh termination signal for refreshing said memory cell array in a predetermined short time shorter than said predetermined long time.

5. A dynamic random access memory device comprising:
   a memory cell array including a plurality of memory cells arranged in rows and columns,
   detection means for detecting non-provision of an externally applied refresh request during a predetermined time length,
   first short time refresh means responsive to said detection means for refreshing said memory cell array in a first predetermined short time,
   long time refresh means for refreshing said memory cell array in a predetermined long time longer than said first predetermined short time, after elapse of said first predetermined short time, and
   second short time refresh means responsive to an externally applied refresh termination signal for refreshing said memory cell array in a second predetermined short time shorter than said predetermined long time.

6. A dynamic random access memory device comprising:
   a memory cell array including a plurality of memory cells arranged in rows and columns,
   detection means for detecting non-provision of an external refresh request during a predetermined time length,
   means for generating a short period clock signal having a predetermined short period,
   means for generating a long period clock signal having a predetermined long period longer than said predetermined short period,
   selector means receiving said short period clock signal and said long period clock signal, and responsive to said detection means for providing said short period clock signal in a predetermined short time term, and for providing said long period clock signal after said predetermined short time term, and
   refresh address generating means responsive to a clock signal provided from said selector means for generating a refresh address signal to refresh said memory cell array.

7. The dynamic random access memory device according to claim 6, wherein said selector means further provides said short period clock signal in response to an externally applied refresh termination signal.

8. The dynamic random access memory device according to claim 6, wherein said refresh address generating means comprises refresh counter means for counting a clock signal provided from said selector means and generating said refresh address signal.

9. The dynamic random access memory device according to claim 6, wherein said long period clock signal generating means comprises frequency divider means for dividing said short period clock signal for generating said long period clock signal.

10. The dynamic random access memory device according to claim 9, wherein said frequency divider means comprises binary counter means driven by said short period clock signal.

11. A dynamic random access memory device comprising:
    a memory cell array including a plurality of memory cells arranged in rows and columns,
    detection means for detecting non-provision of an external refresh request during a predetermined time length,
    means for generating a short period clock signal having a predetermined short period,
    means for generating a long period clock signal having a predetermined long period longer than said predetermined short period,
    selector means receiving said short period clock signal and said long period clock signal, and responsive to said detection means for providing said long period clock signal in a predetermined long time term, and for providing said short period clock signal in response to an externally applied refresh termination signal, and
    refresh address generating means responsive to a clock signal provided from said selector means for generating a refresh address signal for refreshing said memory cell array.

12. A method of operating a dynamic random access memory device including a memory cell array having a plurality of memory cells arranged in rows and columns, said method comprising the steps of:

detecting non-provision of an external refresh request during a predetermined time length, refreshing said memory cell array in a predetermined short time in response to said detection, and refreshing said memory cell array in a predetermined long time longer than said predetermined short time after elapse of said predetermined short time.

13. The method of operating a dynamic random access memory device according to claim 12, further comprising the step of refreshing said memory cell array in a second predetermined short time shorter than said predetermined long time in response to an externally applied refresh termination signal.

14. A method of operating a dynamic random access memory device including a memory cell array having a plurality of memory cells arranged in rows and columns, said method comprising the steps of:

detecting non-provision of an external refresh request during a predetermined time length, refreshing said memory cell array repeatedly in a predetermined long time in response to said detection, and refreshing said memory cell array in a predetermined short time shorter than said predetermined long time in response to an externally applied refresh termination signal.

15. A method of operating a dynamic random access memory device, wherein said memory device includes a memory cell array having a plurality of memory cells arranged in rows and columns, means for generating a short period clock signal having a predetermined short period, means for generating a long period clock signal having a predetermined long period longer than said predetermined short period, and refresh address generating means responsive to an applied clock signal for generating a refresh address signal for refreshing said memory cell array, said operation method comprising the steps of:

initiating a self refresh mode of operation in the absence of an externally applied refresh signal;

supplying said short period clock signal to said refresh address generating means in a predetermined short time term after said initiation of a self refresh mode operation, and supplying said long period clock signal to said refresh address generating means after said predetermined short time term.

16. The method of operating a dynamic random access memory device according to claim 15, further comprising the step of supplying said short period signal to said refresh address generating means in response to an externally applied refresh termination signal.

17. A dynamic random access memory device comprising:

a memory cell array including a plurality of memory cells arranged in a matrix of a plurality of rows and a plurality of columns, a plurality of word lines, each connected to a plurality of memory cells arranged in a corresponding row, a row decoder for receiving an externally applied address signal and a refresh address signal for selectively activating said plurality of word lines, refresh address signal generating means for generating the refresh address signal, means for initiating a self-refresh mode of operation in the absence of an externally applied refresh signal, and refresh control means responsive to a refresh initiation signal for supplying to said refresh address signal generating means a refresh clock signal for controlling a generation timing of the refresh address signal generated from said refresh address signal generating means, in a first refresh term during which a plurality of pulse signals according to a first pulse interval are generated, and in a second refresh term during which a number of pulse signals identical in number to the number of rows in said memory cell array according to a second pulse interval shorter than said first pulse interval are generated.

* * * * *